US012283637B2

United States Patent
Lin et al.

(10) Patent No.: US 12,283,637 B2
(45) Date of Patent: Apr. 22, 2025

(54) MOS CAPACITOR AND FABRICATION METHOD THEREOF

(71) Applicant: UNITED MICROELECTRONICS CORP., Hsin-Chu (TW)

(72) Inventors: Jian-Li Lin, Kaohsiung (TW); Wei-Da Lin, Kaohsiung (TW); Cheng-Guo Chen, Changhua County (TW); Ta-Kang Lo, Taoyuan (TW); Yi-Chuan Chen, Tainan (TW); Huan-Chi Ma, Tainan (TW); Chien-Wen Yu, Kaohsiung (TW); Kuan-Ting Lu, Tainan (TW); Kuo-Yu Liao, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 61 days.

(21) Appl. No.: 17/976,888

(22) Filed: Oct. 31, 2022

(65) Prior Publication Data

US 2023/0048684 A1 Feb. 16, 2023

Related U.S. Application Data

(62) Division of application No. 17/145,416, filed on Jan. 11, 2021, now abandoned.

(30) Foreign Application Priority Data

Dec. 7, 2020 (CN) .......................... 202011429361.X

(51) Int. Cl.
*H01L 29/94* (2006.01)
*H01L 29/66* (2006.01)

(52) U.S. Cl.
CPC ........ *H01L 29/94* (2013.01); *H01L 29/66181* (2013.01)

(58) Field of Classification Search
CPC ............... H01L 29/66181; H01L 29/94; H01L 29/92–945; H01L 29/66174–66189
See application file for complete search history.

(56) References Cited

U.S. PATENT DOCUMENTS

| 6,475,838 B1 * | 11/2002 | Bryant | H01L 27/0805 257/E29.345 |
| --- | --- | --- | --- |
| 2007/0034959 A1 | 2/2007 | Esmark | |
| 2007/0057343 A1 | 3/2007 | Chinthakindi | |
| 2009/0050950 A1 * | 2/2009 | Shibata | H01L 27/0808 257/E29.345 |
| 2013/0260486 A1 | 10/2013 | Huang | |
| 2017/0069766 A1 | 3/2017 | Park | |
| 2019/0103459 A1 | 4/2019 | Lu | |
| 2021/0083129 A1 | 3/2021 | Liu | |

* cited by examiner

*Primary Examiner* — Yu Chen
(74) *Attorney, Agent, or Firm* — Winston Hsu

(57) ABSTRACT

A MOS capacitor includes a substrate having a capacitor forming region thereon, an ion well having a first conductivity type in the substrate, a counter doping region having a second conductivity type in the ion well within the capacitor forming region, a capacitor dielectric layer on the ion well within the capacitor forming region, a gate electrode on the capacitor dielectric layer, a source doping region having the second conductivity type on a first side of the gate electrode within the capacitor forming region, and a drain doping region having the second conductivity type on a second side of the gate electrode within the capacitor forming region.

7 Claims, 3 Drawing Sheets

MOS CAPACITOR AND FABRICATION METHOD THEREOF

CROSS REFERENCE TO RELATED APPLICATIONS

This application is a division of U.S. application Ser. No. 17/145,416, filed on Jan. 11, 2021. The content of the application is incorporated herein by reference.

BACKGROUND OF THE INVENTION

1. Field of the Invention

The invention relates to a semiconductor structure, in particular to a metal-oxide-semiconductor (MOS) capacitor and a fabrication method thereof.

2. Description of the Prior Art

In recent years, due to the strong demand for mobile devices such as mobile phones, CMOS image sensor (ISP) circuits have become increasingly important. The ISP circuit requires the plates of parallel capacitors as voltage doubler and input capacitive coupling in correlated double sampling (CDS).

Currently, the commonly used capacitors are metal-insulator-metal (MIM) capacitors manufactured in the back-end metal process. The disadvantage is that additional photomasks are required, so the manufacturing cost is relatively high. In addition, MIM capacitors are more sensitive to variations in the back-end process, and their capacitance value is related to the metal height and metal profile. Furthermore, MIM capacitors occupy a larger chip area and require additional back-end metal routing.

SUMMARY OF THE INVENTION

It is one object of the present invention to provide an improved metal oxide semiconductor (MOS) capacitor that can overcome the shortcomings and deficiencies in the prior art.

According to one aspect of the invention, a metal-oxide-semiconductor (MOS) capacitor includes a substrate comprising a capacitor forming region thereon; an ion well having a first conductivity type in the substrate; a counter doping region having a second conductivity type in the ion well within the capacitor forming region; a capacitor dielectric layer on the ion well within the capacitor forming region; a gate electrode on the capacitor dielectric layer; a source doping region having the second conductivity type on a first side of the gate electrode within the capacitor forming region; and a drain doping region having the second conductivity type on a second side of the gate electrode within the capacitor forming region.

According to some embodiments, the first conductivity type is P type and the second conductivity type is N type.

According to some embodiments, the ion well is a P well and the counter doping region is an $N^+$ doping region.

According to some embodiments, the counter doping region is located between the source doping region and the drain doping region and is situated directly under the gate electrode.

According to some embodiments, the counter doping region is merged with the source doping region and the drain doping region.

According to some embodiments, the counter doping region, the source doping region, and the drain doping region are electrically connected to a low voltage, and wherein the gate electrode is electrically connected to a high voltage, thereby constituting a capacitor across the capacitor dielectric layer.

According to some embodiments, the low voltage is a ground voltage and the high voltage is between −2.8V-2.8V.

According to some embodiments, the substrate comprises a silicon substrate.

According to some embodiments, the capacitor dielectric layer is a core oxide layer.

According to some embodiments, the core oxide layer has a thickness less than 58 angstroms.

According to another aspect of the invention, a method of forming a metal-oxide-semiconductor (MOS) capacitor is disclosed. A substrate comprising a capacitor forming region thereon is provided. An ion well having a first conductivity type is formed in the substrate. A counter doping region having a second conductivity type is formed in the ion well within the capacitor forming region. A capacitor dielectric layer is formed on the ion well within the capacitor forming region. A gate electrode is formed on the capacitor dielectric layer. A source doping region having the second conductivity type is formed on a first side of the gate electrode within the capacitor forming region. A drain doping region having the second conductivity type is formed on a second side of the gate electrode within the capacitor forming region.

According to some embodiments, the first conductivity type is P type and the second conductivity type is N type.

According to some embodiments, the step of forming a counter doping region having a second conductivity type in the ion well within the capacitor forming region comprises: implanting dopants having the second conductivity type into the ion well with an energy of about 15-25KeV and a dosage of about 1E15-5E15 atoms/cm$^2$; and subjecting the counter doping region and the ion well to a rapid thermal anneal (RTP) process at a temperature of about 950-1060 degrees Celsius.

According to some embodiments, the counter doping region is located between the source doping region and the drain doping region and is situated directly under the gate electrode.

According to some embodiments, the counter doping region is merged with the source doping region and the drain doping region.

According to some embodiments, the counter doping region, the source doping region, and the drain doping region are electrically connected to a low voltage, and wherein the gate electrode is electrically connected to a high voltage, thereby constituting a capacitor across the capacitor dielectric layer.

According to some embodiments, the low voltage is a ground voltage and the high voltage is between −2.8V-2.8V.

According to some embodiments, the substrate comprises a silicon substrate.

According to some embodiments, the capacitor dielectric layer is a core oxide layer.

According to some embodiments, the core oxide layer has a thickness less than 58 angstroms.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
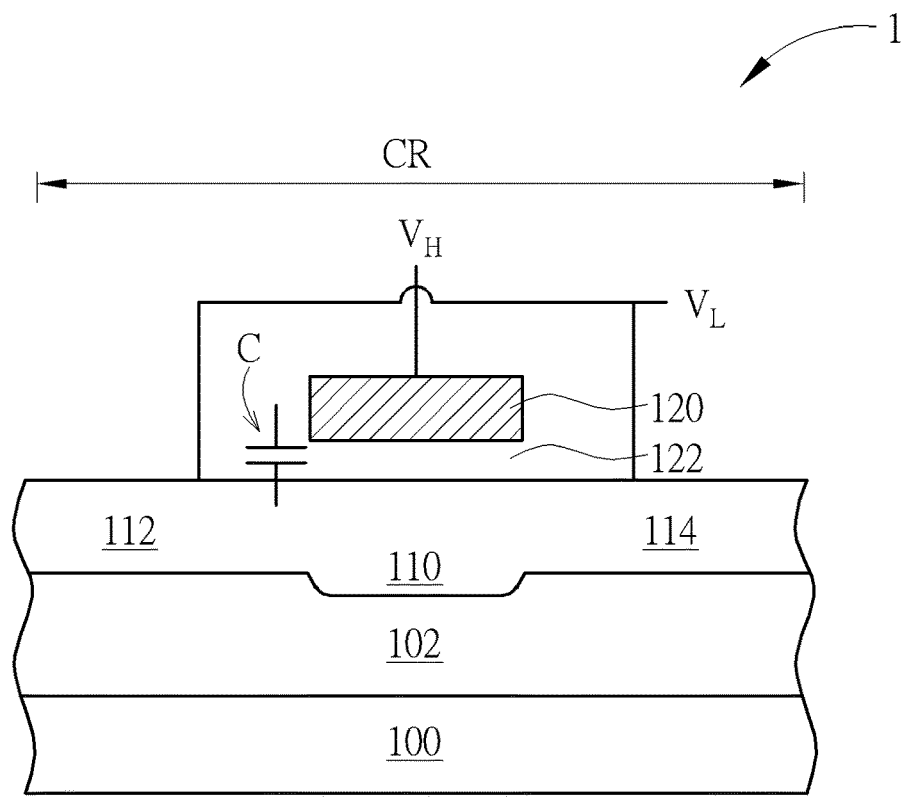
FIG. 1 is a schematic cross-sectional diagram of a MOS capacitor according to an embodiment of the present invention.

Please refer to FIG. 1, which is a schematic cross-sectional view of a metal oxide semiconductor (MOS) capacitor according to an embodiment of the present invention. As shown in FIG. 1, the MOS capacitor 1 includes a substrate 100, for example, a semiconductor substrate, on which a capacitor forming region CR is included. According to an embodiment of the present invention, the semiconductor substrate is, for example, a silicon substrate, but is not limited thereto. An ion well 102 is provided in the substrate 100 and has a first conductivity type. According to an embodiment of the present invention, the first conductivity type is, for example, P type, and the ion well 102 is, for example, P type well. In the ion well 102 within the capacitor forming region CR, a counter doping region 110 is provided with a second conductivity type. According to an embodiment of the present invention, the second conductivity type is, for example, N type, and the counter doping region 110 is, for example, an $N^+$ doped region. In some embodiments, the first conductivity type may be, for example, N type, and the second conductivity type may be, for example, P type.

According to an embodiment of the present invention, a capacitor dielectric layer 122 is provided on the ion well 102 within the capacitor forming region CR. According to an embodiment of the present invention, the capacitor dielectric layer 122 is, for example, a core oxide layer. According to an embodiment of the present invention, the thickness of the core oxide layer is less than 58 angstroms, and is approximately equal to the thickness of the gate oxide layer of the core circuit transistor.

According to an embodiment of the present invention, a gate electrode 120 is provided on the capacitor dielectric layer 122. According to an embodiment of the present invention, the gate electrode 120 may include polysilicon or metal, but is not limited thereto. On the first side of the gate electrode 120 in the capacitor forming region CR, a source doping region 112 having the second conductivity type is provided. On the second side of the gate electrode 120 in the capacitor forming region CR, a drain doping region 114 having the second conductivity type is provided. According to an embodiment of the present invention, the second conductivity type is, for example, N type, and the source doping region 112 and the drain doping region 114 are, for example, $N^+$ doped regions.

According to an embodiment of the present invention, the counter doping region 110 is located between the source doping region 112 and the drain doping region 114 and is located directly under the gate electrode 120. The counter doping region 110 merges with the source doping region 112 and the drain doping region 114. The counter doping region 110, the source doping region 112, and the drain doping region 114 are electrically connected to a low voltage $V_L$, and the gate electrode 120 is electrically connected to a high voltage $V_H$ so as to constitute a capacitor C across the capacitor dielectric layer 122. The low voltage $V_L$ may be a ground voltage, and the high voltage $V_H$ may be between −2.8V and 2.8V.

Figure 2:
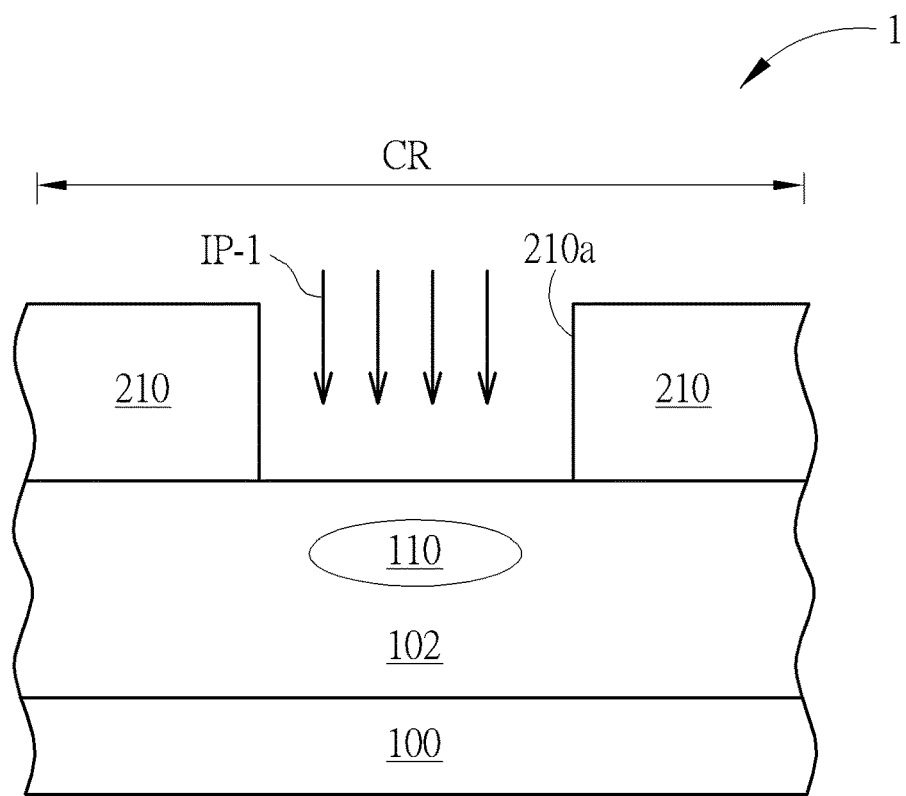
FIG. 2 to FIG. 5 illustrate a method of forming a MOS capacitor.

Please refer to FIG. 2 to FIG. 5, which illustrate a method of forming a MOS capacitor. As shown in FIG. 2, first, a substrate 100 is provided, which includes a capacitor forming region CR. According to an embodiment of the present invention, the semiconductor substrate 100 is, for example, a silicon substrate, but is not limited thereto. Next, an ion well 102 having the first conductivity type is formed in the substrate 100. According to an embodiment of the present invention, the first conductivity type is, for example, P type, and the ion well 102 is, for example, P type well. Then, a photoresist pattern 210 is formed on the substrate 100, which has an opening 210a that exposes part of the surface of the substrate 100. Next, an ion implantation process IP-1 is performed to form a counter doping region 110 having the second conductivity type in the ion well 102 in the capacitor forming region CR through the opening 210a.

According to an embodiment of the present invention, the ion implantation process IP-1 specifically includes: implanting dopants with the second conductivity type, for example, arsenic, into the ion well 102 with an energy of about 15-25 KeV and a dosage of about $1E15-5E15/cm^2$. The counter doping region 110 and the ion well 102 are then subjected to a rapid thermal annealing (RTP) process at a temperature of 950-1060 degrees Celsius. By performed the above-exemplified ion implantation process IP-1, the time-dependent dielectric breakdown (TDDB) performance of the capacitor dielectric layer 122 can be effectively improved.

Figure 3:
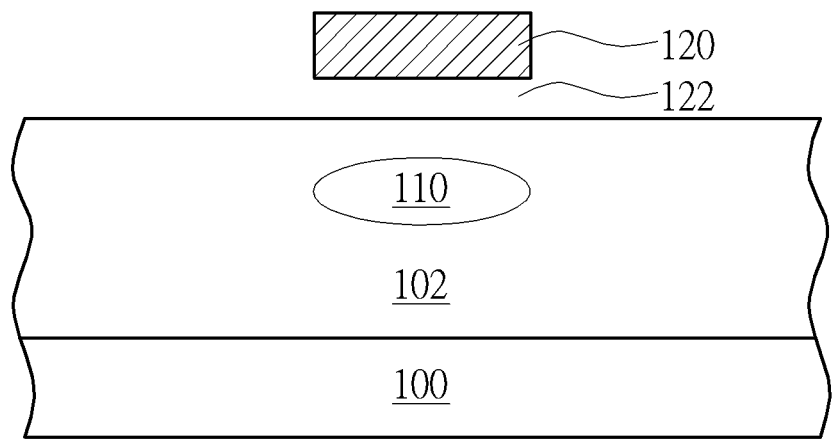

As shown in FIG. 3, a capacitor dielectric layer 122 is then formed on the ion well 102 in the capacitor forming region CR, and a gate electrode 120 is formed on the capacitor dielectric layer 122. According to an embodiment of the present invention, the capacitor dielectric layer 122 is, for example, a core oxide layer, such as silicon dioxide. According to an embodiment of the present invention, the thickness of the core oxide layer is less than 58 angstroms, and is approximately equal to the thickness of the gate oxide layer of the core circuit transistor. According to an embodiment of the present invention, the gate electrode 120 may include polysilicon or metal, but is not limited thereto.

Figure 4:
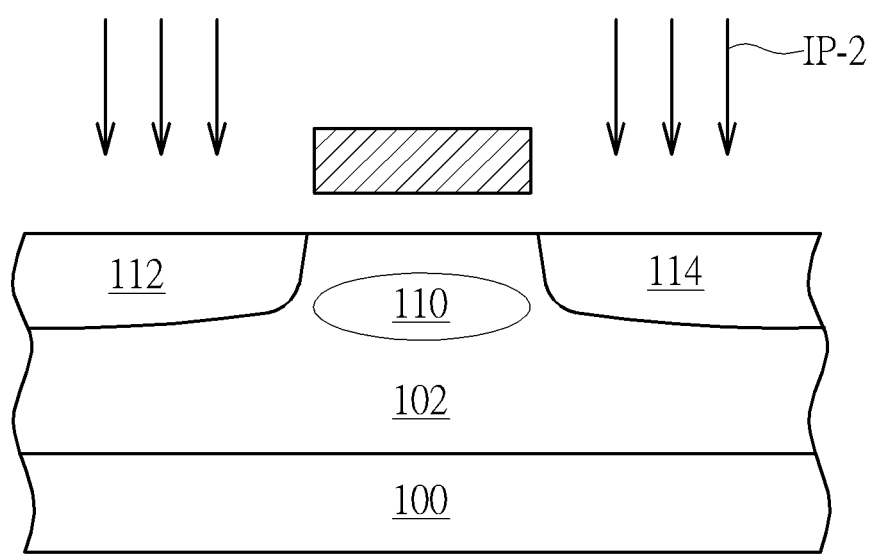

As shown in FIG. 4, an ion implantation process IP-2 is then performed to form a source doping region 112 of the second conductivity type on the first side of the gate electrode 120 in the capacitor forming region CR, and a drain doping region 114 of the second conductivity type on the second side of the gate electrode 120 in the capacitor forming region CR. According to an embodiment of the present invention, the second conductivity type is, for example, N type, and the source doping region 112 and the drain doping region 114 are, for example, $N^+$ doped regions.

Figure 5:
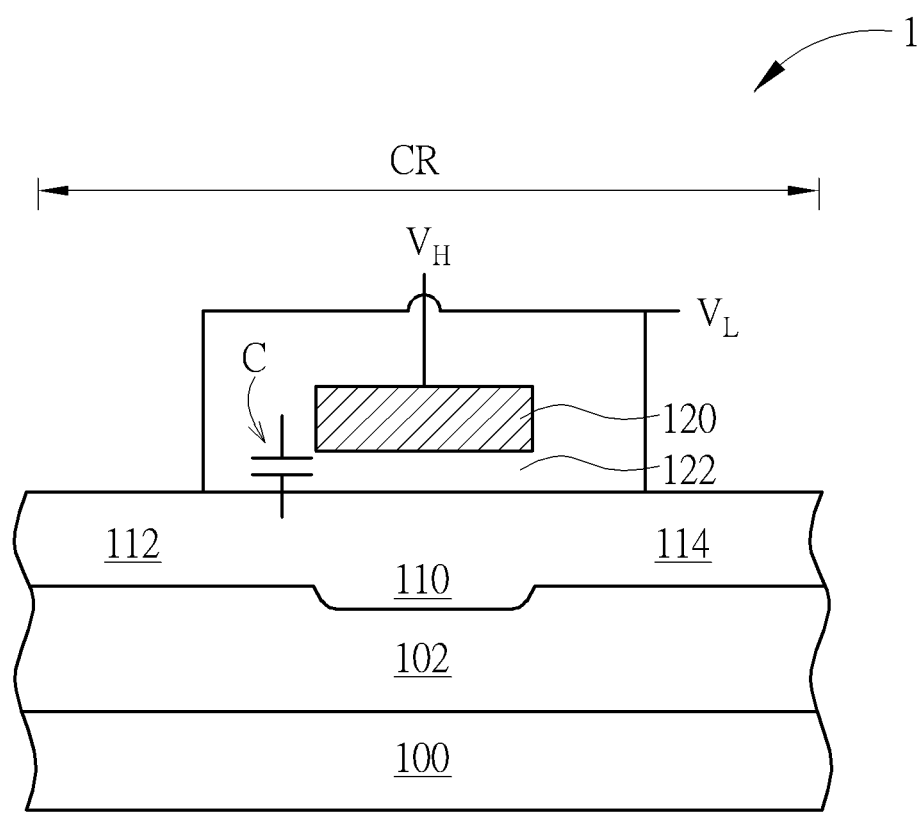

As shown in FIG. 5, an annealing process is then performed to activate the dopants in the source doping region 112 and the drain doping region 114. The counter doping region 110 is located between the source doping region 112 and the drain doping region 114 and is located directly under the gate electrode 120. After the annealing process is performed, the counter doping region 110 merges with the source doping region 112 and the drain doping region 114, so that the region between the source doping region 112 and the drain doping region 114 becomes an N-type doped region. The counter doping region 110, the source doping region 112, and the drain doping region 114 are electrically connected to a low voltage $V_L$, and the gate electrode 120 is electrically connected to a high voltage $V_H$ so as to constitute a capacitor C across the capacitor dielectric layer 122. The low voltage $V_L$ may be a ground voltage, and the high voltage $V_H$ may be between -2.8V and 2.8V.

The main advantage of the present invention is that the MOS capacitor can provide stable voltage-independent capacitance, and by forming a counter doping region 110 in the ion well, the threshold voltage (Vt) is shifted to gate voltage Vg less than 0V, for example, less than −5V, keeping the underside of the gate electrode of the MOS capacitor in the inversion zone. Because the MOS capacitor is compatible with the front-end manufacturing process, they can provide competitive unit capacitance values, and have higher circuit density and lower manufacturing costs. In addition, the use of the core oxide layer as the capacitor dielectric layer can greatly increase the capacitance value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a metal-oxide-semiconductor (MOS) capacitor, comprising:
   providing a substrate comprising a capacitor forming region thereon;
   forming an ion well having a first conductivity type in the substrate;
   forming a counter doping region having a second conductivity type in the ion well within the capacitor forming region by performing only one implantation step of implanting dopants having the second conductivity type into the ion well with an energy of about 15-25KeV and a dosage of about 1E15-5E15 atoms/cm$^2$; and subjecting the counter doping region and the ion well to a rapid thermal anneal process at a temperature of about 950-1060 degrees Celsius;
   forming a capacitor dielectric layer on the ion well within the capacitor forming region;
   forming a gate electrode on the capacitor dielectric layer after performing the only one implantation step;
   forming a source doping region having the second conductivity type on a first side of the gate electrode within the capacitor forming region;
   forming a drain doping region having the second conductivity type on a second side of the gate electrode within the capacitor forming region,
      wherein the source doping region and the drain doping region are formed by implanting dopants having the second conductivity type after forming the gate electrode,
      wherein the second conductivity type is opposite to the first conductivity type,
      wherein the source doping region and the drain doping region are spaced apart from the counter doping region after the implantation steps by interposing regions of the ion well having the first conductive type; and
   performing an annealing process to activate dopants in the source doping region and the drain doping region,
      wherein after performing the annealing process, the counter doping region merges with the source doping region and the drain doping region in the interposing regions of the ion well,
      wherein the counter doping region has a junction directly underneath the counter doping region in the ion well that is deeper than a lowest junction of the source doping region or a lowest junction of the drain doping region in the ion well.

2. The method of forming a MOS capacitor according to claim 1, wherein the first conductivity type is P type and the second conductivity type is N type.

3. The method of forming a MOS capacitor according to claim 1, wherein the counter doping region is located between the source doping region and the drain doping region and is situated directly under the gate electrode.

4. The method of forming a MOS capacitor according to claim 1, wherein the counter doping region, the source doping region, and the drain doping region are electrically connected to a low voltage, and wherein the gate electrode is electrically connected to a high voltage, thereby constituting a capacitor across the capacitor dielectric layer.

5. The method of forming a MOS capacitor according to claim 1, wherein the substrate comprises a silicon substrate.

6. The method of forming a MOS capacitor according to claim 1, wherein the capacitor dielectric layer is a core oxide layer.

7. The method of forming a MOS capacitor according to claim 6, wherein the core oxide layer has a thickness less than 58 angstroms.

* * * * *